United States Patent [19]

Sangyoji et al.

[11] Patent Number: 4,996,552
[45] Date of Patent: Feb. 26, 1991

[54] IMAGE EXPOSURE DEVICE FOR EXPOSING PHOTOSENSITIVE RECORDING MEDIUM TO COLOR IMAGE LIGHTS

[75] Inventors: Kazuo Sangyoji, Nagoya; Hiroshi Kawahara, Aichi, both of Japan

[73] Assignee: Brother Kogyo Kabushiki Kaisha, Japan

[21] Appl. No.: 506,467

[22] Filed: Apr. 9, 1990

[30] Foreign Application Priority Data

Apr. 7, 1989 [JP] Japan ................................. 1-89485

[51] Int. Cl.$^5$ ............................................. G03B 27/00
[52] U.S. Cl. ......................................... 355/1; 355/20; 355/27; 355/32
[58] Field of Search .................. 355/1, 20, 32, 41, 88, 355/27; 346/107 R

[56] References Cited

U.S. PATENT DOCUMENTS

| | | | |
|---|---|---|---|
| 3,449,046 | 6/1969 | White | 355/1 |
| 3,594,080 | 7/1971 | McMillin | 355/41 X |
| 4,279,483 | 7/1981 | England et al. | 355/1 X |
| 4,351,602 | 9/1982 | Yamada | 355/1 X |
| 4,375,649 | 3/1983 | Mir | 355/32 X |
| 4,478,504 | 10/1984 | Tanaka | 355/1 |
| 4,544,259 | 10/1985 | Kanaoka et al. | 355/1 |
| 4,760,421 | 7/1988 | Margolin | 355/1 |
| 4,918,467 | 4/1990 | Sanford | 355/20 X |
| 4,933,708 | 6/1990 | Asano et al. | 355/32 |

Primary Examiner—Richard A. Wintercorn
Attorney, Agent, or Firm—Oliff & Berridge

[57] ABSTRACT

An exposure device used in an image forming apparatus for exposing a photosensitive recording medium carrying microcapsules on one surface thereof to color image lights produced in accordance with color image data representing an original image to form a latent image corresponding to the original image, includes a fiber optics tube (FOT) having an optical fiber array serving an exposing surface for producing the color image lights in accordance with the color image data and selectively exposing the photosensitive recording medium to the color image lights to form the latent image on the photosensitive recording medium, the exposing surface being disposed in such a manner as to confront the other surface of the photosensitive recording medium, a FOT driving circuit for driving the FOT, and a control unit for controlling the FOT driving circuit so that the color image lights are selectively produced in accordance with the image data inputted thereto and the color image lights thus produced are irradiated to the photosensitive recording medium.

6 Claims, 3 Drawing Sheets

IMAGE EXPOSURE DEVICE FOR EXPOSING PHOTOSENSITIVE RECORDING MEDIUM TO COLOR IMAGE LIGHTS

BACKGROUND OF THE INVENTION

This invention relates to an exposure device having a fiber optics tube (hereinafter referred to as "FOT") for exposing a photosensitive recording medium to light to form a color image in accordance with an image data inputted to the FOT.

There has been known an image forming apparatus in which an image light is irradiated to a photosensitive and pressure-sensitive recording medium by an exposure device such as a cathode-ray tube (CRT) or the like to form an image on the photosensitive and pressure-sensitive recording medium. On the other hand, a fiber optics tube (FOT) having an optical fiber array provided at an exposing surface thereof has been known as a compact display unit, however, has not been hitherto used as an exposure device for forming an image.

In view of the above, the applicant of this application has proposed an exposure device for exposing a photosensitive recording medium to light using an optic fiber tube to form an image on the photosensitive recording medium as disclosed in Japanese Patent Application No. 63-199279.

The photosensitive recording medium used in the above conventional image forming apparatus comprises a sheet substrate such as PET (polyethylene terephthalate) or the like, and photosensitive microcapsules encapsulating dye precursors which are coated on one surface of the sheet substrate. In this photosensitive recording medium, a sheet substrate of black color is ordinarily used for preventing halation in the photosensitive recording medium due to reflection of light from the sheet substrate, and therefore it is required to irradiate light to the photosensitive recording medium through the microcapsule coating surface thereof. This requirement also requires the optic fiber array of the FOT to be disposed in a confronting relation to the microcapsule coating surface of the photosensitive recording medium. That is, the optic fiber array is disposed so that an image light emitted from the optic fiber array is directly irradiated to the microcapsules coating surface of the photosensitive recording medium. In this case, the optic fiber array must be disposed at an interval away from the microcapsule coating surface of the photosensitive recording medium in order to prevent the microcapsules coated on the sheet substrate from being damaged by a contact between the optic fiber array and the microcapsule coating surface, so that a gap is intentionally provided between the optic fiber array and the microcapsule coating surface of the photosensitive recording medium. Accordingly, it frequently occurs that the light emitted from the optic fiber array is slightly diffused in the gap, so that an image having a deteriorated image quality is formed on the photosensitive recording medium, and a clear color image is not obtained with high resolution.

SUMMARY OF THE INVENTION

An object of this invention is to provide an image forming apparatus capable of easily forming a clear color image with high resolution using a fiber optics tube as an exposure device.

In order to attain the above object, an exposure device according to this invention in which a photosensitive recording medium carrying microcapsules on one surface thereof is exposed to color image lights produced in accordance with color image data representing an original image to form a latent image corresponding to the original image, comprises exposing means having an exposing surface for producing the color image lights in accordance with the color image data and selectively exposing the photosensitive recording medium to the color image lights to form the latent image on the photosensitive recording medium, said exposing surface being disposed in such a manner as to confront the other surface of the photosensitive recording medium, and control means for driving and controlling the exposing means to produce the color image lights in accordance with the image data inputted thereto and expose the color image lights to the photosensitive recording medium.

The exposing means according to this invention comprises a fiber optics tube (FOT) having an optical fiber array serving as the exposing surface for selectively emitting the color image lights in accordance with the color image data and exposing the photosensitive recording medium to the color image lights.

In the image forming apparatus thus constructed, in accordance with the color image data on the original image inputted to the exposure unit comprising the fiber optics tube, the color image lights are irradiated to the microcapsule coating surface of the photosensitive recording medium through the non-microcapsule coating surface of the photosensitive recording medium from the optical fiber array serving as the exposing surface of the fiber optics tube. In this case, even if the optical fiber array of the fiber optics tube is contacted with the non-microcapsule coating surface of the photosensitive recording medium, the microcapsules on the microcapsule coating surface (recording surface) are not damaged and are exposed to the light at a point-blank range.

DETAILED DESCRIPTION OF THE DRAWINGS

The preferred embodiment of this invention will be described hereunder with reference to the accompanying drawings.

Figure 1:
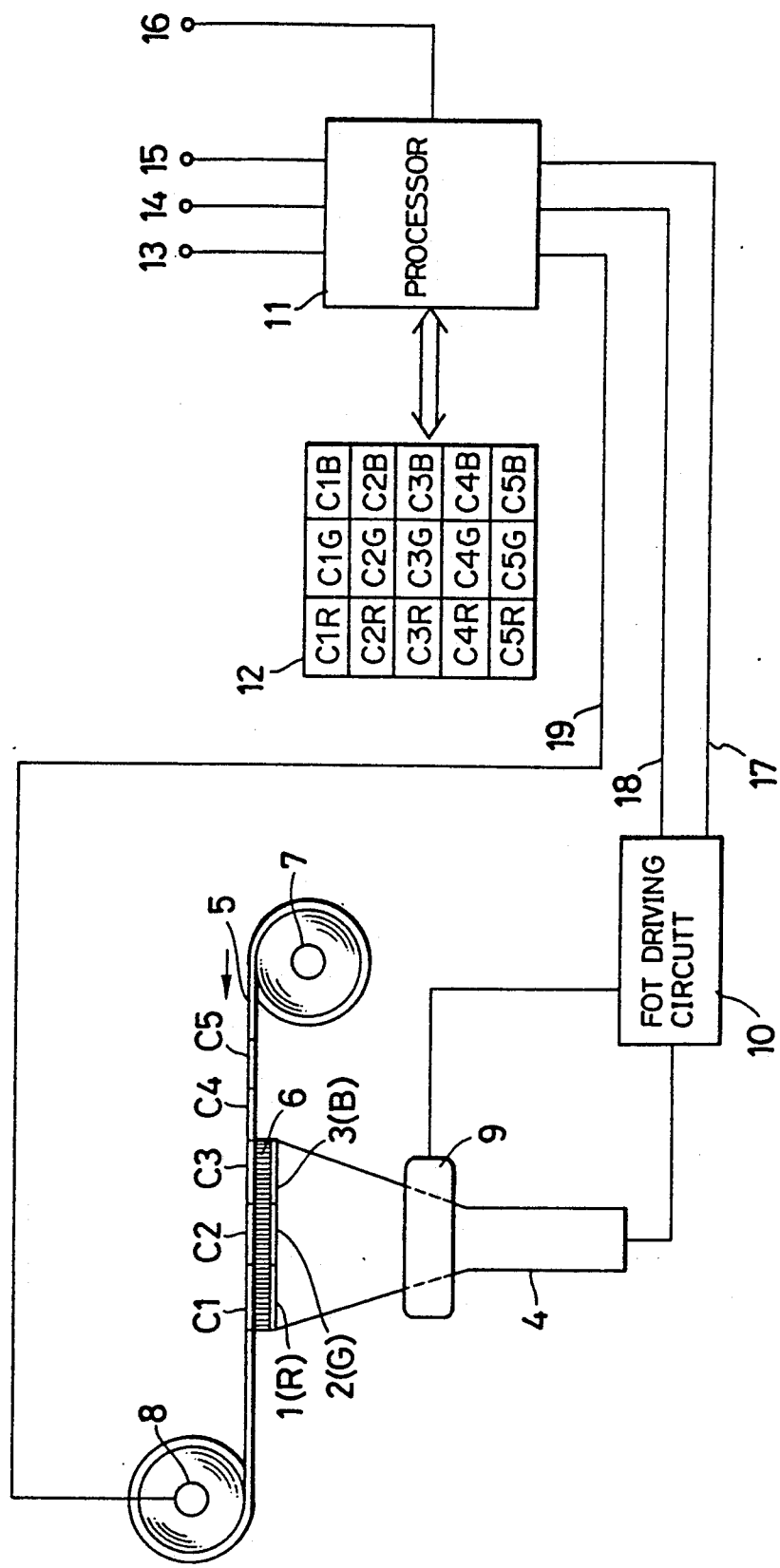
FIG. 1 is a schematic view of an embodiment of an image exposure device according to this invention.

FIG. 1 is a schematic view of one embodiment of an image exposure device according to this invention.

In FIG. 1, an fiber optics tube (FOT) 4 has an exposing surface comprising, for example, a red phosphor surface 1(R) for emitting a red image light, a green phosphor surface 2(G) for emitting a green image light and a blue phosphor surface 3(B) for emitting a blue image light, and an optical fiber array 6 provided to the exposing surface for guiding the color image lights to the photosensitive recording medium 5. A photosensitive and pressure-sensitive recording medium 5 (hereinafter referred to as "medium") comprises a support member formed of PET and microcapsules coated on one surface of the support member and so on, and is accommodated by a cartridge shaft 7 while wound around the shaft 7.

The medium 5 is drawn out of the cartridge shaft 7 and passed through an exposure region where the medium 5 is exposed to the color image lights by the optical fiber array 6 while contacted with the optical fiber array 6. The microcapsules are coated on one surface of a support member of the medium 5, which does not confront the optical fiber array 6 (hereinafter referred to as "microcapsule coating surface"). In other words, the optical fiber array 6 is contacted with the other surface of the support member of PET on which no microcapsules are coated. In this case, the support member is not colored and thus is transparent, but a halation of the medium 5 can be prevented because the optical fiber array 6 is contacted with the surface of the support member. It is believed that this effect is brought about because the light emitted from the optical fiber array would be remarkably prevented from being diffused. The support member of the medium 5 may be damaged by the contact with the optical fiber array 6. However, it is proved by an experiment that the damage of the sheet substrate has no affection on the resolution and image quality of an output image. The medium 5 which has been exposed by the optical fiber array 6 of the FOT 4 is would up by a take-up shaft 8. An feeding operation of the medium 5 is controlled by a sheet feed device (not shown).

The FOT 4 is further provided with a polarizing yoke 9. The FOT 4 and the polarizing yoke 9 are driven and controlled by an FOT driving circuit 10, and the FOT driving circuit 10 and the feeding operation of the medium 5 are controlled by a processor 11 in accordance with various input signals and data stored in a RAM 12 as described hereinafter.

The processor 11 is supplied with color discrimination signals 13, 14 and 15 representing an original image and a synchronizing signal 16, and data of the color discrimination signals 13, 14 and 15 are stored as image data in the RAM 12 through the processor 12. The processor 11 forms a synchronizing control signal 18 from the synchronizing signal 16, and outputs the image data 17 which is read from the RAM 12 and the synchronizing control signal 18 to the FOT driving circuit 10 and the sheet feeding device (not shown), respectively. Further, the processor 11 outputs a sheet feed control signal to the sheet feeding device such as a motor (not shown).

In the RAM 12 are stored a red image data C1R for producing a red image light to which a C1 imaging area of the medium 5 is exposed, a green image data C1G for producing a green image light to which the C1 imaging area is exposed, a green image data C1B for producing a blue image light to which the C1 imaging area is exposed, and other color data C2R to C5B for producing the respective color image lights to which C2 to C5 imaging areas of the medium 5 are exposed, respectively.

The following table indicates combinations between the image data and between the exposing surfaces of the FOT 4 and the imaging areas on the medium 5.

TABLE

| CYCLE | COMBINATIONS BETWEEN DATA SIGNALS | | | COMBINATIONS BETWEEN EXPOSING AND IMAGING SURFACES | | |
| --- | --- | --- | --- | --- | --- | --- |
| 1 | C1R | C2G | C3B | 1-C1, | 2-C2, | 3-C3 |
| 2 | C2R | C3G | C4B | 1-C2, | 2-C3, | 3-C4 |
| 3 | C3R | C4G | C5B | 1-C3, | 2-C4, | 3-C5 |
| 4 | C4R | C5G | — | 1-C4, | 2-C5, | |
| 5 | C5R | — | — | 1-C5 | | |
| 6 | — | C1G | C2B | | 2-C1, | 3-C2 |
| 7 | — | — | C1B | | | 3-C1 |

First, the photosensitive recording medium 5 is fed to the exposure region by the sheet feeding device such that the red phosphor surface 1(R) of the FOT 4 confronts the C1 imaging area on the medium 5 and thus the green and blue phosphor surface 2(G) and 3(B) confront the C2 and C3 imaging areas on the medium 5. At this time, the processor 11 outputs the C1R image data to the FOT 4 through the FOT driving circuit 10, and outputs the synchronizing control signal 18 to the FOT driving signal to control the polarizing yoke 9. In response to the synchronizing control signal 18, the polarizing yoke 9 is controlled to scan the red phosphor surface 1(R) and thus expose the C1 imaging area on the medium 5 to the red image light. Thereafter, the processor 11 outputs the C2G image data to the FOT 4 through the FOT driving circuit 10, and the polarizing yoke 9 is controlled to scan the green phosphor surface 2(G) and thus expose the C2 imaging area to the green image light. Finally, the blue phosphor surface 3(B) is scanned, that is, the C3 imaging area is exposed to the blue image light in the same manner as described above. During these scanning (exposing) operations, the medium 5 remains still.

Assuming that a series of the above steps constitutes one cycle, every one cycle is completed, the medium 5 is forwardly or backwardly moved and a next cycle is carried out with a different combination of the data signals. This operation is repeated until a seventh cycle is completed, whereby a color image is formed on the imaging areas C1 to C5 of the medium 5.

As described above, at the positions where the medium 5 is still, the processor 11 outputs to the FOT 4 the image data for producing the color image lights to the imaging areas confronting the respective color phosphor surfaces to thereby substantially simultaneously expose the corresponding image areas to the color image lights, so that a sheet feeding number is reduced and a time required for completing the whole exposure process is shortened. For example, assuming that one second is required for performing an exposure process for one color, a time required for all of the exposure processes is 15 (1×15) seconds. Further, assuming that one second is required for performing one sheet feeding operation, a time required for all of the sheet feeding operations is 6 (1×6) seconds. Accordingly, a time required for completing one image forming process is 21 (15+6), and this time is shorter than a time required in the conventional image forming apparatus. In addition to an effect of shortening the time of an image forming process, use of the FOT 4 enables the exposure device to be miniaturized, and also enables an completely focused imaging on the medium 5.

Figure 2:
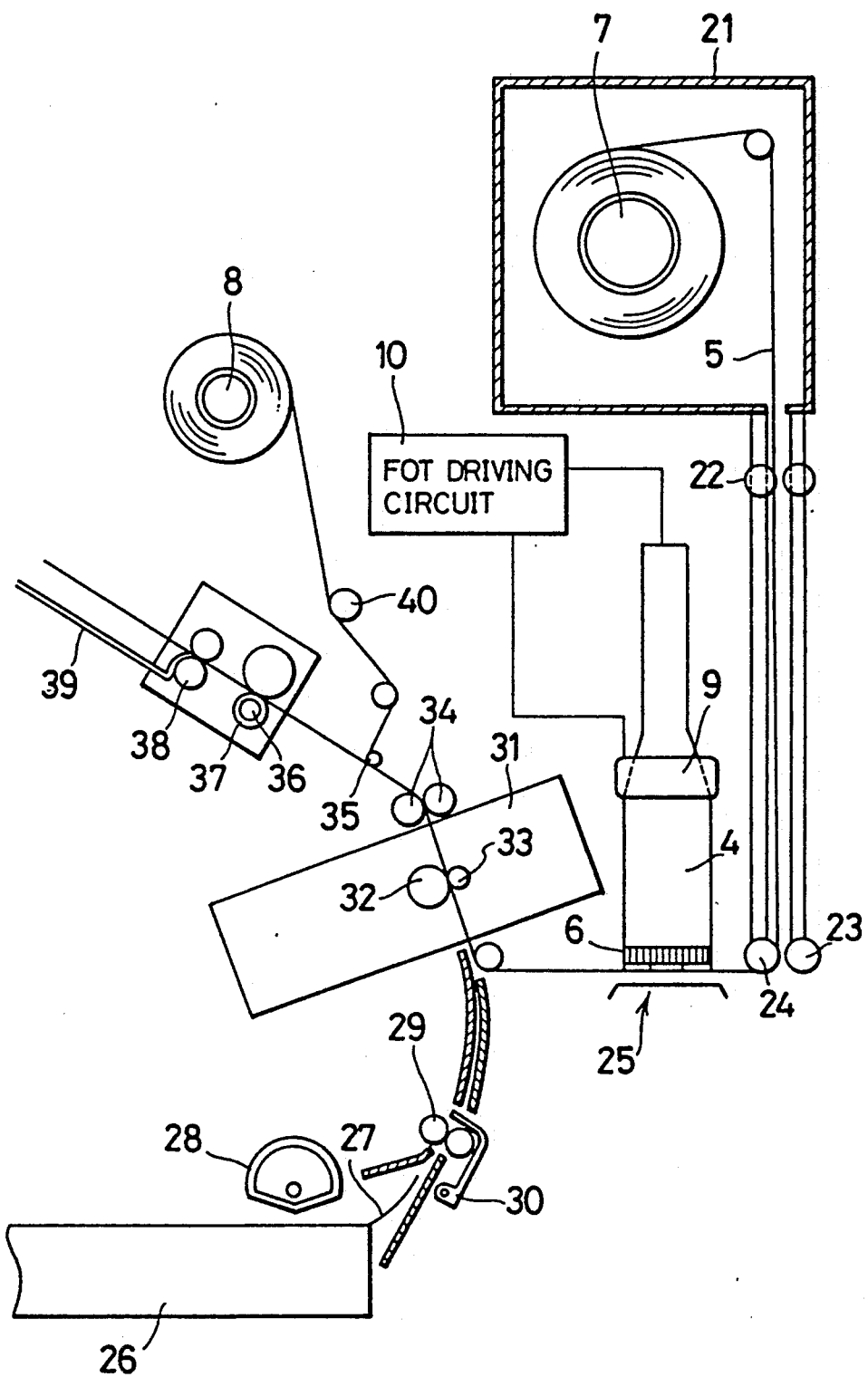
FIG. 2 is a schematic view of an image forming apparatus equipped with the image exposure device as shown in FIG. 2.

FIG. 2 is a schematic view of an image forming apparatus using the exposure device as shown in FIG. 1. In FIG. 2, the same elements as those of FIG. 1 are represented by the same reference numerals, and the description thereof is eliminated.

The image forming apparatus as shown in FIG. 2 includes a cartridge 21 for mounting the cartridge shaft 7 therein and thus accommodating the photosensitive and pressure-sensitive recording medium 5, a pair of sheet feed rollers 22, a nip roller 23, a barrel roller 24, an exposure unit 25 including the exposure device as shown in FIG. 1, a developer sheet cassette 26 for accommodating a stack of developer sheets 27 therein, a sector roller 28 for picking up a topmost developer sheet 27 from the stack of the developer sheets, a resist gate 30 for adjusting a sheet supply timing, and a pressure-developing unit 31 for performing a pressure development to form a visible image on the developer sheet.

The developer sheet 27 and the medium 5 which has been exposed to the color image lights are fed to the pressure-developing unit 31 while closely contacted with each other under pressure. The pressure-developing unit 31 comprises a backup roller 32 and a small diameter roller 33. The contacted medium 5 and the developer sheet 27 is pressure-developed under pressure in a gap between the backup roller 32 and the small diameter roller 33 to form a visible image corresponding to a latent image on the medium 5.

The image forming apparatus is further provided with a pair of rollers 34 for feeding the contacted medium 5 and the developer sheet 27, a separation roller 35 for separating the developer sheet from the medium 5, a heat-fixing unit comprising a heater 36 and a heat roller 37 for thermally heat the visible heat image on the developer sheet 27, a discharge roller 38, a discharging tray 39 and a meandering adjusting roller 40 for adjusting a take-up operation of a take-up shaft 8.

In the image forming apparatus thus constructed, the medium 5 is fed to the exposure unit 25 by a sheet feeding device (not shown) to be subjected to an exposure process. The exposure process is performed by the FOT 4 and controlled by the FOT driving circuit 10. Thereafter, the exposed medium 5 is fed to the pressure-developing unit along with the developer sheet 27 which has bene supplied from the cassette 26 in synchronism with the feeding operation of the medium 5 to perform a positional registration between the developer sheet 26 and the latent image on the medium 5. In the pressure-developing unit, the latent image on the medium 5 is developed into a visible image on the developer sheet 27, and then the visible image is thermally fixed by the heat-fixing unit.

Figure 3:
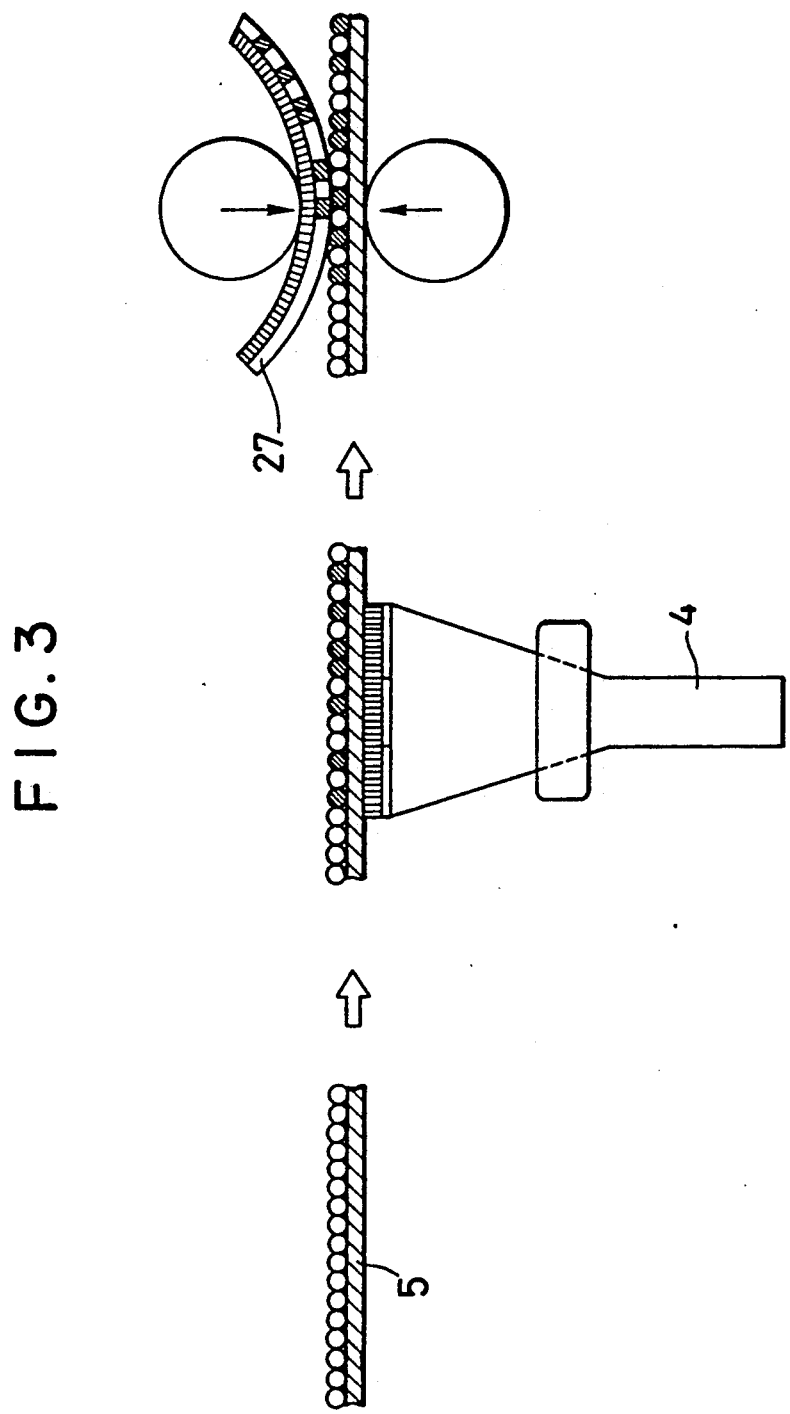
FIG. 3 is an explanatory diagram for explaining the principle of forming a color image using a photosensitive and pressure-sensitive microcapsule sheet.

FIG. 3 is an explanatory diagram for explaining the principle of an image formation process.

As shown in FIG. 3, the photosensitive and pressure-sensitive recording medium 5 coated with the microcapsules thereon is exposed to the light by the FOT 4 to photo-cure the microcapsules and form a latent image on the medium 5, and then supplied with a pressure by the pressure-developing unit while closely contacted with the developer sheet 27, thereby developing the latent image on the medium 5 into a visible image on the developer sheet 27. The microcapsules which have not been exposed to the light or are to be colored on the medium 5, have a weak mechanical strength and thus are liable to be ruptured during the pressure-developing process. Accordingly, the exposed microcapsules are photo-cured, but the non-exposed microcapsules are ruptured to issue the encapsulated dye precursors. The issued dye precursors are reacted with the developer material on the developer sheet to form the visible image on the developer sheet.

As described above, according to this invention, since the exposure process of the photosensitive and pressure-sensitive recording medium are performed while the optical fiber array of the FOT and one surface of the support member on which no microcapsules are carried, are contacted with each other, the image light emitted from the optical fiber array is completely absorbed by the microcapsules on the medium without diffusion of the light. Accordingly, a clear color image can be obtained with high resolution.

Further, in comparison with the conventional cathode-ray tube serving an exposure device, the loss of amount of light emitted from the optical fiber array is more reduced and an exposure efficiency is more enhanced because no optical lens is unnecessary in this invention and no gap occurs between the exposure device and the photosensitive and pressure-sensitive recording medium which is fed to the exposure region. In addition to the above advantages, the image forming apparatus of this invention is wholly miniaturized because an optical length is not necessary to be considered and therefore the size of the apparatus is not restricted by the optical length.

What is claimed is:

1. An exposure device used in an image forming apparatus for exposing a photosensitive recording medium carrying microcapsules on one surface thereof to color image lights produced in accordance with color image data representing an original image to form a latent image corresponding to the original image, comprising:
    exposing means having plural exposing surfaces for producing the color image lights in accordance with the color image data and selectively exposing the photosensitive recording medium to the color image lights to form the latent image on the photosensitive recording medium, said exposing surfaces being disposed in such a manner as to confront the other surface of the photosensitive recording medium; and
    control means for driving and controlling said exposing means to produce the color image lights in accordance with the image data inputted thereto and expose the color image lights to the photosensitive recording medium.

2. An image exposure device as claimed in claim 1, wherein said exposing means comprises a fiber optics tube having red, green and blue phosphor surfaces serving as the exposing surface for emitting the color image lights in accordance with the image data.

3. An image exposure device as claimed in claim 2, wherein said exposing means further comprises an optical fiber array provided on said exposing surface for guiding the color image lights produced on the exposing surface.

4. An image exposure device as claimed in claim 1, wherein the photosensitive recording medium comprises a transparent support member and microcapsules coated on said support member.

5. An image exposure device as claimed in claim 1, wherein said control means comprises a fiber optics tube driving circuit for driving said fiber optics tube, a random access memory for storing the color image data therein and a processor for controlling said fiber optics tube driving circuit in accordance with the color image data stored in said random access memory.

6. An image forming apparatus for exposing a photosensitive recording medium carrying microcapsules on one surface thereof to color image lights produced in accordance with color image data representing an original image to form a latent image corresponding to the original image and developing the latent image on the photosensitive recording medium into a visible image on a developer sheet, comprising:

a fiber optics tube having plural color phosphor surfaces serving as an exposing surface for producing the color image lights in accordance with the color image data and selectively exposing the photosensitive recording medium to the color image lights in accordance with the color image data, said color phosphor surfaces being disposed in such a manner as to confront the other surface of the photosensitive recording medium;

a control unit for storing the color image data therein and controlling said fiber optics tube in accordance with the color image data so that the color image lights are selectively produced and irradiated to the photosensitive recording medium;

a pressure-developing unit for applying a pressure to the photosensitive recording medium having the latent image thereon while the photosensitive recording medium is superposed on the developer sheet, thereby developing the latent image on the photosensitive recording medium into a visible image on the developer sheet; and a heat-fixing unit for thermally fixing the visible image on the developer sheet.

* * * * *